(12) United States Patent
Rowell et al.

(10) Patent No.: US 10,914,775 B2
(45) Date of Patent: Feb. 9, 2021

(54) MEASURING SYSTEM AND METHOD WITH DIGITAL QUIET ZONE

(71) Applicant: Rohde & Schwarz GmbH & Co. KG, Munich (DE)

(72) Inventors: Corbett Rowell, Munich (DE); Adam Tankielun, Ottobrunn (DE); Daniel Markert, Deggendorf (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 193 days.

(21) Appl. No.: 15/495,288

(22) Filed: Apr. 24, 2017

(65) Prior Publication Data

US 2018/0269996 A1 Sep. 20, 2018

(30) Foreign Application Priority Data

Mar. 17, 2017 (EP) .................................. 17161516

(51) Int. Cl.
*H04B 7/04* (2017.01)
*G01R 29/10* (2006.01)
*H04B 17/00* (2015.01)
*H04B 17/10* (2015.01)
*G01R 29/08* (2006.01)

(52) U.S. Cl.
CPC ....... *G01R 29/105* (2013.01); *G01R 29/0821* (2013.01); *H04B 17/0085* (2013.01); *H04B 17/102* (2015.01)

(58) Field of Classification Search
CPC .. H04B 7/0617; H04B 7/0695; H04B 7/0408; H04B 7/088; H04B 7/043
See application file for complete search history.

(56) References Cited

U.S. PATENT DOCUMENTS 9,502,022 B2 11/2016 Chang et al.
2007/0263748 A1* 11/2007 Mesecher .............. H01Q 1/282
375/299

(Continued)

FOREIGN PATENT DOCUMENTS

GB 2531310 A 4/2016
WO 2016059140 A1 4/2016
WO WO-2016059140 A1 * 4/2016 ............... H01Q 3/02

OTHER PUBLICATIONS

Chinese Office Action for related Chinese Patent Application No. 201710266086.6 dated Aug. 24, 2020, 18 Pages.

*Primary Examiner* — Alesa Allgood
(74) *Attorney, Agent, or Firm* — Ditthavong & Steiner, P.C.

(57) ABSTRACT

A measuring system for measuring properties of a device under test over the air comprises an antenna array, adapted to receive first measuring signals from the device under test, a measuring device adapted to process the first measuring signals received by the antenna array, and to generate second measuring signals and transmit them to the device under test, using the antenna array. The measuring device comprises a quiet zone generator, which is adapted to perform a beamforming of the first measuring signals after reception by the antenna array. It is preferably also adapted to perform a beamforming on the second measuring signals before transmission by the antenna array. The quiet zone generator is adapted to apply the beamforming, so that at least one adjustable quiet zone is achieved.

16 Claims, 7 Drawing Sheets

(56) References Cited

U.S. PATENT DOCUMENTS

2012/0314791 A1* 12/2012 Zhang .................. H04B 7/0617
   375/267
2016/0149623 A1*  5/2016 Psaromiligkos ......... H04B 1/12
   375/295
2016/0226570 A1*  8/2016 Nicholls .............. H04B 7/0897

* cited by examiner

MEASURING SYSTEM AND METHOD WITH DIGITAL QUIET ZONE

PRIORITY

This application claims priority of European patent application EP 17 161 516.4 filed on Mar. 17, 2017, which is incorporated by reference herewith.

FIELD OF THE INVENTION

The invention relates to a measuring system and measuring method for measuring properties of a device under test over the air.

BACKGROUND OF THE INVENTION

When performing measurements on a device under test over the air, it is important to prevent the influence of surrounding objects on the measurement. These objects can be for example the measuring antenna or the measuring device, or any other objects. This is usually done by placing the device under test a great distance away from any further objects. Thereby, far-field conditions are achieved. This approach though is disadvantageous, since very large measurement setups are required, in order to reach far-field conditions.

Alternatively, measurements maybe performed under near field conditions. This leads to inaccurate measurements, though.

There exists an approach of converting near-field conditions into far-field conditions, using a planewave converter. Such planewave converters are put into practice by a large number of analog phase shifters and individual antennas. Such planewave converters result in a very large scale implementation and are very costly. For example, the international patent application WO 2016/059140 A1 shows such an analog planewave converter.

Thus, there is a need to provide a measuring system and method, which allow for a measurement of a device under test at near-field distance, but under far-field conditions, without requiring large and costly measurement setups.

SUMMARY OF THE INVENTION

An inventive measuring system for measuring properties of a device under test over the air comprises an antenna array, adapted to receive first measuring signals from the device under test, a measuring device adapted to process the first measuring signals received by the antenna array, and to generate second measuring signals and transmit them to the device under test, using the antenna array.

The measuring device moreover comprises a quiet zone generator, which is adapted to perform a beamforming of the first measuring signals after reception by the antenna array. Preferably the quiet zone generator is also adapted to perform a beamforming on the second measuring signals before transmission by the antenna array. The quiet zone generator is adapted to apply the beamforming so that at least one adjustable quiet zone is achieved. Thereby, it is possible to artificially generate a quiet zone at significantly shorter distances from the measuring device than regular far-field conditions.

Advantageously, the quiet zone generator is adapted to apply the beamforming so that the at least one quiet zone is moveable. A high measuring flexibility is thereby achieved.

Further advantageously, the quiet zone generator is adapted to apply the beamforming so that at least one adjustable further quiet zone is achieved simultaneously to the at least one quiet zone. It is thereby possible to perform measurements on to different devices simultaneously.

Also advantageously, the measuring device comprises an analyzer and/or signal generator, which is adapted to analyze transmitted or received signals from the, and to the at least one quiet zone. Thereby, no further measuring equipment is necessary to perform the measurement.

The quiet zone generator is moreover advantageously adapted to apply the beamforming so that the at least one quiet zone is in the near field of the antenna array. This results in an especially small footprint of the measuring setup.

Advantageously, the measuring device comprises a baseband unit and a radio frequency unit for each antenna of the antenna array. This allows for a very accurate and low-cost beamforming.

Further advantageously, the radio frequency units are adapted to receive the first measuring signals from the antennas of the antenna array and to generate first baseband signals therefrom. The baseband units are then adapted to generate the first I/Q signals, based upon the first baseband signals. The quiet zone generator is then adapted to perform a reception beamforming on the first I/Q signals in order to generate the at least one quiet zone.

Alternatively or additionally, the quiet zone generator is adapted to generate second I/Q signals for processing by the baseband units, the baseband units are then adapted to generate second baseband signals based on the provided I/Q signals. The radio frequency units are further adapted to generate the second measuring signals from the baseband signals and transmit them using the antennas of the antenna array. The quiet zone generator is in this case adapted to generate the I/Q signals so as to implement a transmission beamforming generating the at least one quiet zone. By these two alternative or additional measures, a reception and/or a transmission using a quiet zone are possible.

Further advantageously, the quiet zone generator, the baseband units and the radio frequency units form a plane wave converter with baseband beamforming. An especially accurate forming of the quiet zone is thereby possible.

Further advantageously, the measuring system comprises an anechoic chamber. Thereby, influences from outside objects are further reduced.

Further advantageously, the antenna array and the device under test are arranged within the anechoic chamber. This reduces the interference significantly.

Advantageously, the quiet zone generator is adapted to perform the beamforming so that the at least one quiet zone is moveable within the anechoic chamber. It is thereby possible to perform measurements on the device under test within the anechoic chamber within the quiet zone with great accuracy.

Preferably the measuring device is adapted to generate an interference signal based on a digital manipulation of the second measuring signals. Thereby, it is possible to test the device under test under challenging conditions.

Further advantageously, the quiet zone generator is adapted to perform a beamforming of the interference signal. It is thereby possible to control the measuring environment in an accurate manner.

Advantageously, the measuring device is adapted to generate the interference signal so that it is spatially overlapping at least in parts with the generated quiet zone. A measurement under far field conditions but in the presence of interference is thereby possible.

Further advantageously, the measuring device is adapted to generate the interference signal so that at least one antenna of the antenna array is exclusively used to generate the interference signal. This solution is especially simple to implement.

Advantageously, the measuring device is adapted to generate the interference signal so that it is angled by an angle $\Theta$ with regard to a beamforming beam generating the quiet zone. This allows for testing the device under test and especially challenging circumstances.

Further advantageously, the measuring device is adapted to perform an interference signal beamforming and a quiet zone beamforming simultaneously. This allows for controlling the testing environment in an especially accurate manner.

Advantageously, the measuring device is adapted to generate a plurality of interference signals simultaneously. This allows for a test of the device under test under especially challenging circumstances.

An inventive method for measuring the properties of a device under test comprises the steps receiving first measuring signals from the device under test, using an antenna array, generating second measuring signals and transmitting them to the device under test, using the antenna array, performing a beamforming on the first measuring signals after reception by the antenna array, performing a beamforming on the second measuring signals, before transmission to the antenna array, and applying the beamforming so that at least one adjustable quiet zone is achieved. Thereby, it is possible to artificially generate a quiet zone at significantly shorter distances from the measuring device than regular far-field conditions.

An inventive computer program with program code means for performing all steps according to the previously shown method, if the program is executed on a computer or digital processor, is provided.

BRIEF DESCRIPTION OF THE DRAWINGS

Exemplary embodiments of the invention are now further explained with respect to the drawings by way of the example only. In the drawings.

DETAILED DESCRIPTION OF THE PREFERRED EMBODIMENTS

Figure 1:
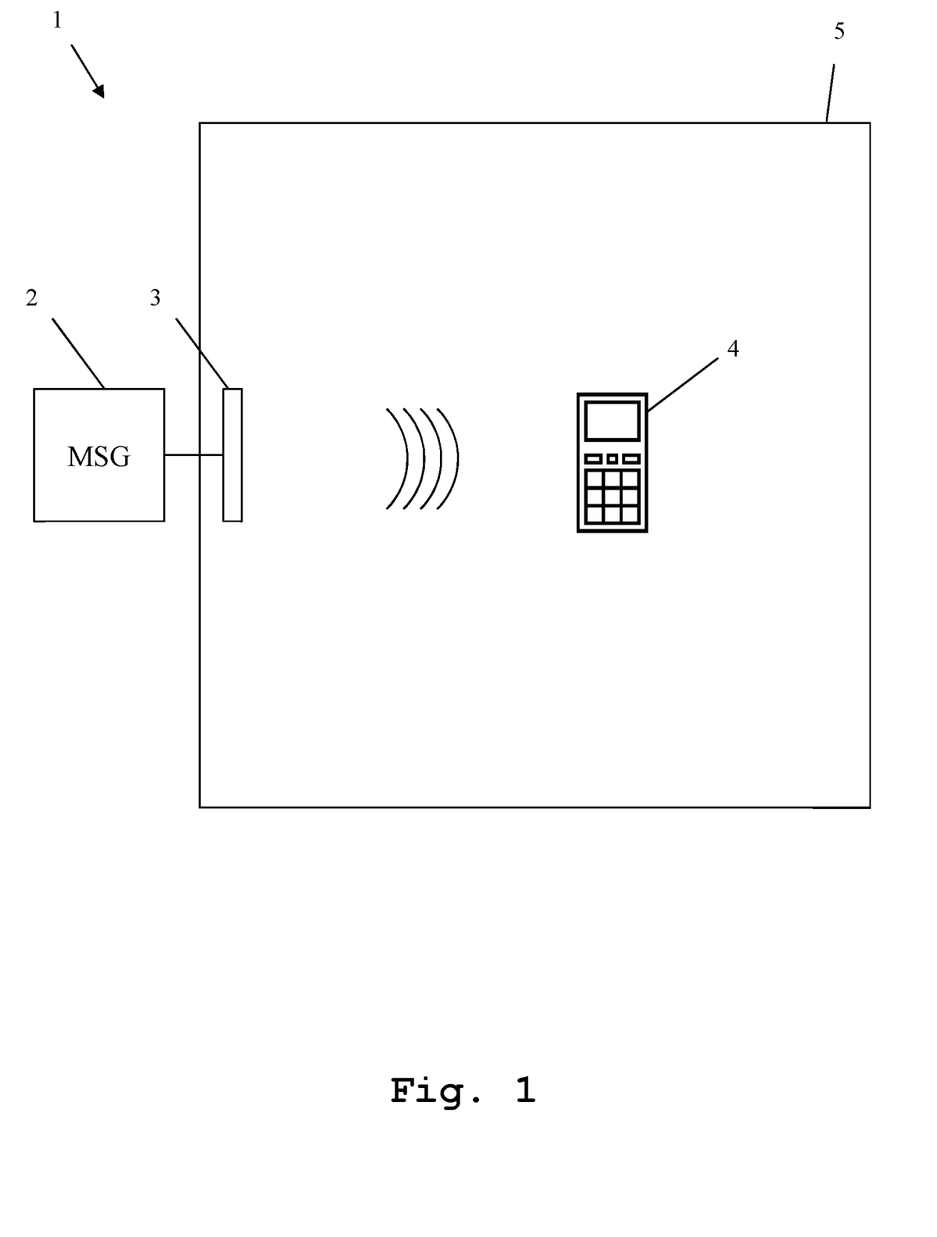
FIG. 1 shows an exemplary measuring system.

First, we demonstrate the underlying problem along FIG. 1. Along FIG. 2-FIG. 6, different embodiments of the inventive measuring system are explained with regard to their construction and function in detail. Along FIG. 7, finally the function of an embodiment of the inventive measuring method is shown. Similar entities and reference numbers in different figures have been partially omitted.

In FIG. 1, an exemplary measuring system 1 is shown. A measuring device 2 is connected to a measuring antenna 3. The measuring antenna 3 is arranged in an anechoic chambers, while the measuring device 2 is arranged outside.

Moreover, in the anechoic chamber 5, a device under test 4 is arranged. The device under test 4 is arranged in line of sight of the measuring antenna 3. Although the anechoic chambers reduce reflections on its walls to a great degree, such reflections still exist. This results in a reduced measuring accuracy. More importantly though, the anechoic chamber 5 is usually smaller than the far field distance at the measuring frequency. Therefore, the device under test 4 is within near field conditions with regard to the measuring antenna 3. This negatively influences the measurements, since there exists an interaction between the measuring antenna 3 and the antenna of the device under test 4.

Figure 2:
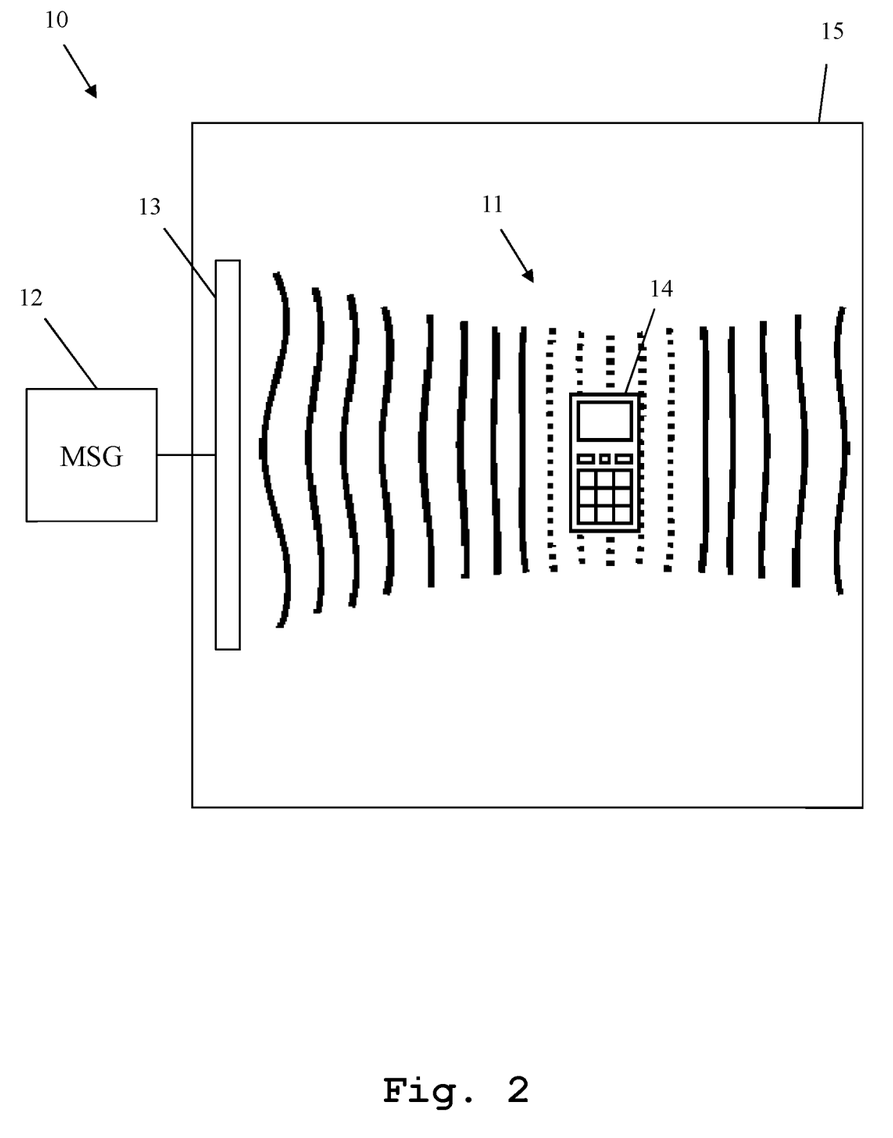
FIG. 2 shows a first embodiment of an inventive measuring system.

In FIG. 2, a first embodiment of the measuring system 10 according to the present invention is shown. Here, a measuring device 12 is connected to an antenna array 13, which is placed within an anechoic chamber 15. Within the anechoic chamber 15, additionally a device under test 14 is placed. The device under test 14 is placed within a quiet zone 11, which is generated by the measuring device 12 jointly with the antenna array 13.

The quiet zone 11 within the anechoic chamber 15 is generated by performing a beamforming, using the antenna array 13. The signals for performing the beamforming are provided by the measuring device 12. The beamforming is not only applied to signals transmitted by the measuring device 12, using the antenna array 13, but also a reception beamforming of signals generated and transmitted by the device under test 14 is performed. By this beamforming, an adjustable quiet zone 11 is placed within the anechoic chamber 15. By adjusting the beamforming, the size, position and quality of the quiet zone can be modified. The two factors quality and size can be adjusted against each other. This means that a larger quiet zone of reduced quality or a smaller quiet zone of increased quality can be generated.

It is important to note, that the quiet zone beamforming is independent from the measured or transmitted signal. The quiet zone 11 is a predefined zone.

Figure 3:
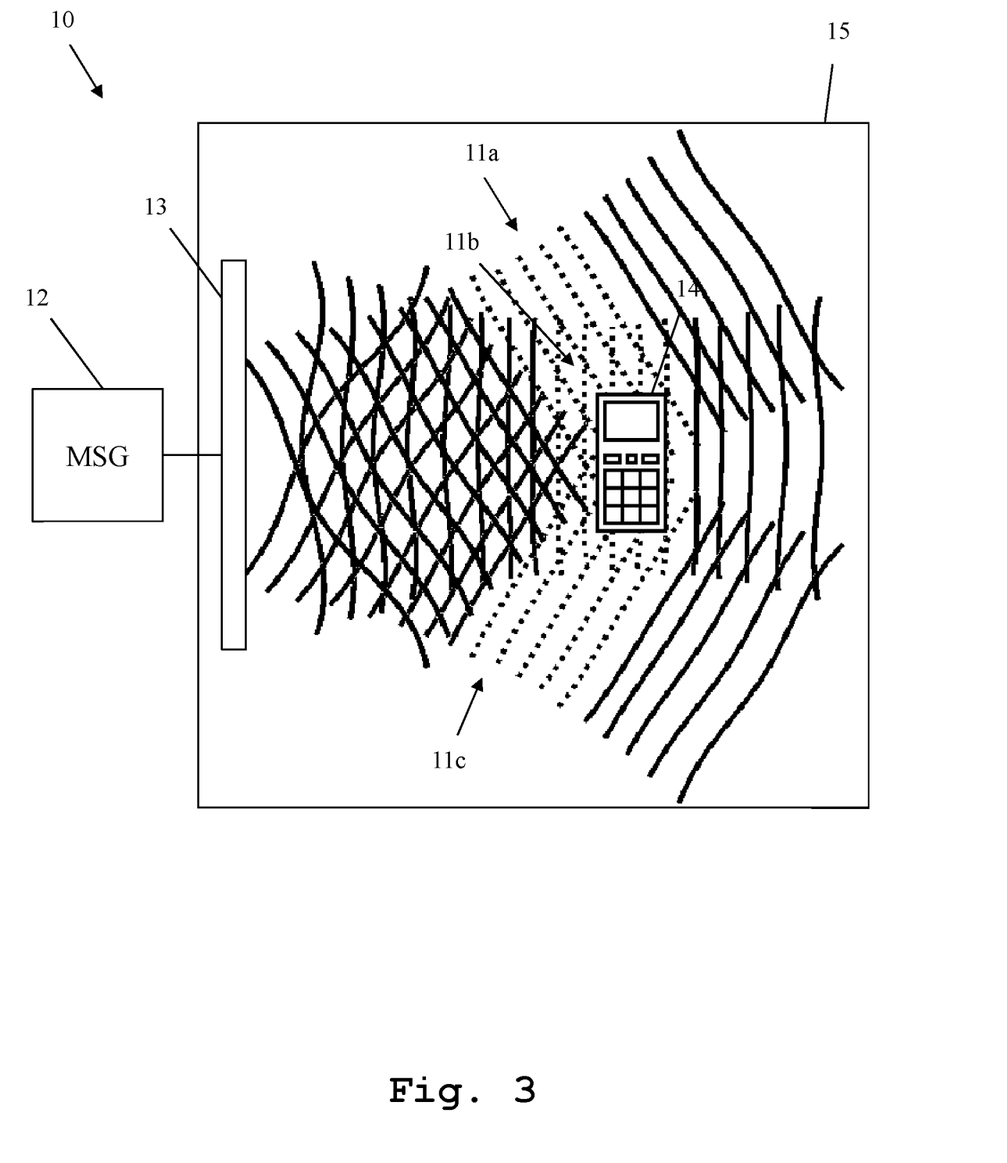
FIG. 3 shows a second embodiment of an inventive measuring system.

Also, it is possible to generate more than one quiet zone. This is shown in FIG. 3. In FIG. 3, three independent quiet zones 11a, 11b and 11c are placed within the anechoic chamber 15, by use of beamforming by the measuring device 12, together with the antenna array 13. There is no limitation to one or three quiet zones though. Also one quiet zone of adjustable shape or any other number of quiet zones of adjustable shape can be generated. As explained along FIG. 2, the higher the quality of the quiet zone(s), the lower the achievable size and the lower the flexibility with regard to the placing of the quiet zone.

Regarding the generation of the quiet zone, it is further referred to the later elaborations regarding FIGS. 4-6.

Figure 4:
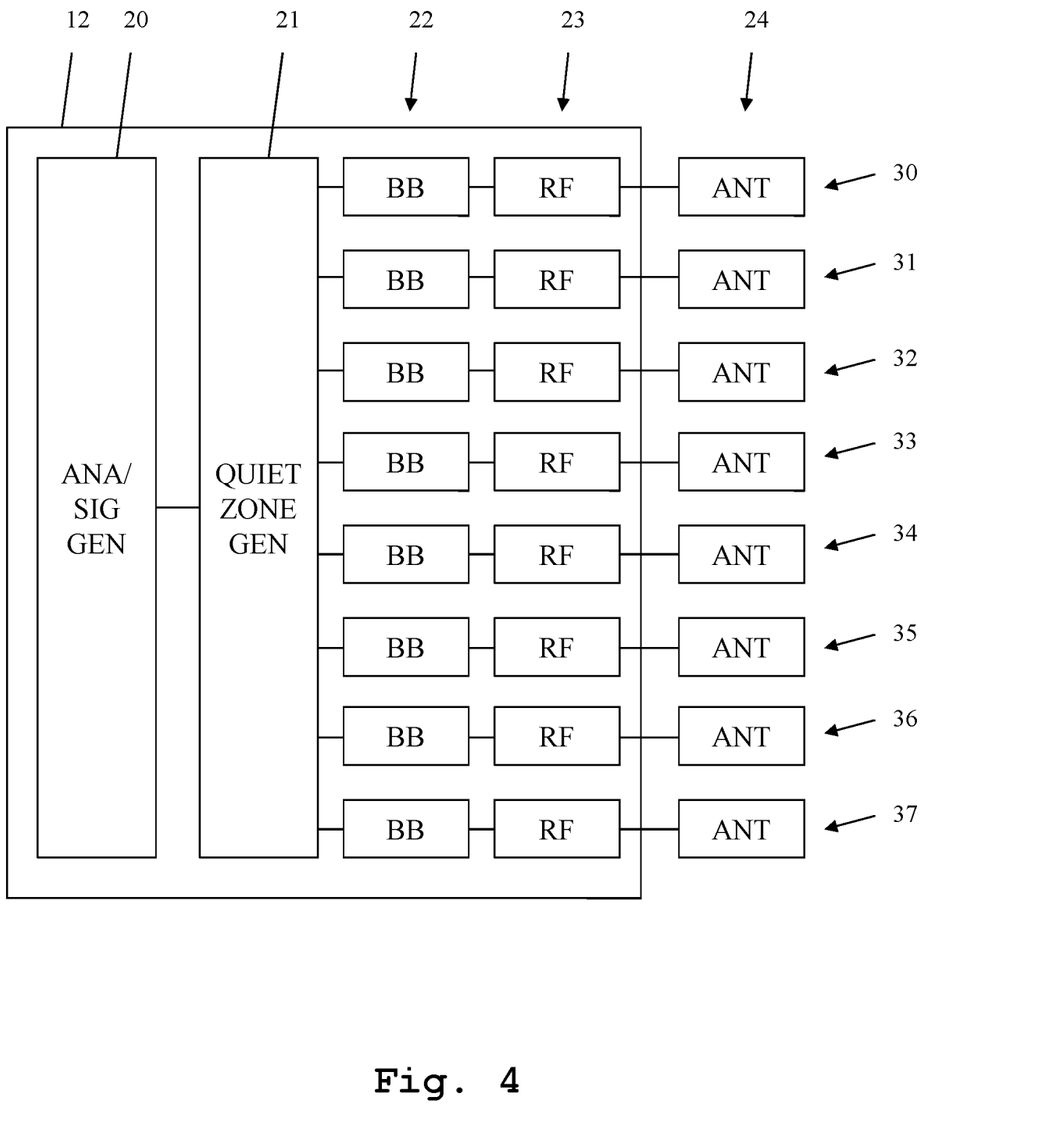
FIG. 4 shows a detailed view of a third embodiment of the inventive measuring system.

In FIG. 4, an inner construction detail of the measuring device 12 is shown. The measuring device 12 comprises an analyzer and/or signal generator 20, which is connected to a quiet zone generator 21. The quiet zone generator 21 moreover is connected to a number of baseband units 22, one for each antenna 24 of the antenna array 13. Each of the baseband units 22 is moreover connected to a radio frequency unit 23, one for each antenna 24 of the antenna array 13. Therefore, the quiet zone generator 21 is connected to a plurality of signal paths 30-37, which each comprise one baseband unit 22, one radio frequency unit 23, and one antenna 24.

When performing a transmission beamforming, the analyzer and/or signal generator 20 operates as signal generator and provides a signal to be transmitted to the device under test 14. This signal is handed to the quiet zone generator 21, which generates a plurality of signals for the different signal paths 30-37. These signals are handed to the baseband units 22. These signals are each provided to the baseband unit 22 in form of an inphase component and a quadrature-component for each baseband unit. These signals are then converted by the baseband units to baseband signals by performing a baseband modulation. The resulting baseband signals are handed to the radio frequency units 23, which perform a modulation to the radio frequency. The resulting radio frequency signals are handed to the antennas 24 of the antenna array 13, and are transmitted.

By setting the individual I- and Q-component-signals by the quiet zone generator 21, a quiet zone is generated by performing a beamforming of the actually transmitted signal. The actual parameters for generating such a beamforming can be determined mathematically from a model, or can alternatively be determined empirically, by performing a series of measurements and recording the results. For example within a lookup table, for each possible position and size of one or more quiet zones, a set of parameters can be stored and used when a quiet zone needs to be placed accordingly.

For performing a reception beamforming, the opposite order of steps is performed. A signal emitted by the device under test is received by the individual antennas 24 of the antenna array 13. The received signals are processed by the radio frequency units 23 so as to achieve baseband signals. The baseband signals are handed to the baseband units 22, which determine inphase- and quadrature-component signals therefrom. These component signals are handed to the quiet zone generator 21, which performs a digital reception beamforming thereupon. Also regarding this beamforming, the same parameters used for the transmission beamforming can be used. The resulting signal is handed to the analyzer and/or signal generator, which operates as an analyzer, for further processing.

The baseband units 22, the radio frequency units 23 and the quiet zone generator 21 thereby form a plane wave converter, which operates digitally in the baseband.

In addition to generating a quiet zone 11, the measuring system is moreover able to generate an interference signal based on a digital manipulation of the signal emitted to the device under test 14.

In transmission mode, the analyzer and/or signal generator 20 operates as a signal generator. It generates the signal to be transmitted to the device under test 14 so that an additional interference is present.

This interference can also be beamformed. In this case, the interference signal is handed to the quiet zone generator along with according beamforming information. The quiet zone generator then also performs the according digital beamforming to generate the beamformed interference signal along with the test signal.

The interference signal may be spatially overlapping at least in parts with the generated quiet zone.

Also, at least one antenna of the antenna array 13 may be used to exclusively generate the interference signal.

Moreover, the interference signal may be angled by an angle Θ with regard to the quiet zone producing beam.

Also, a simultaneous operation of the quiet zone beamforming and the interference signal beamforming is possible.

In addition, not only one, but a plurality of interference signals may be generated simultaneously.

Figure 5:
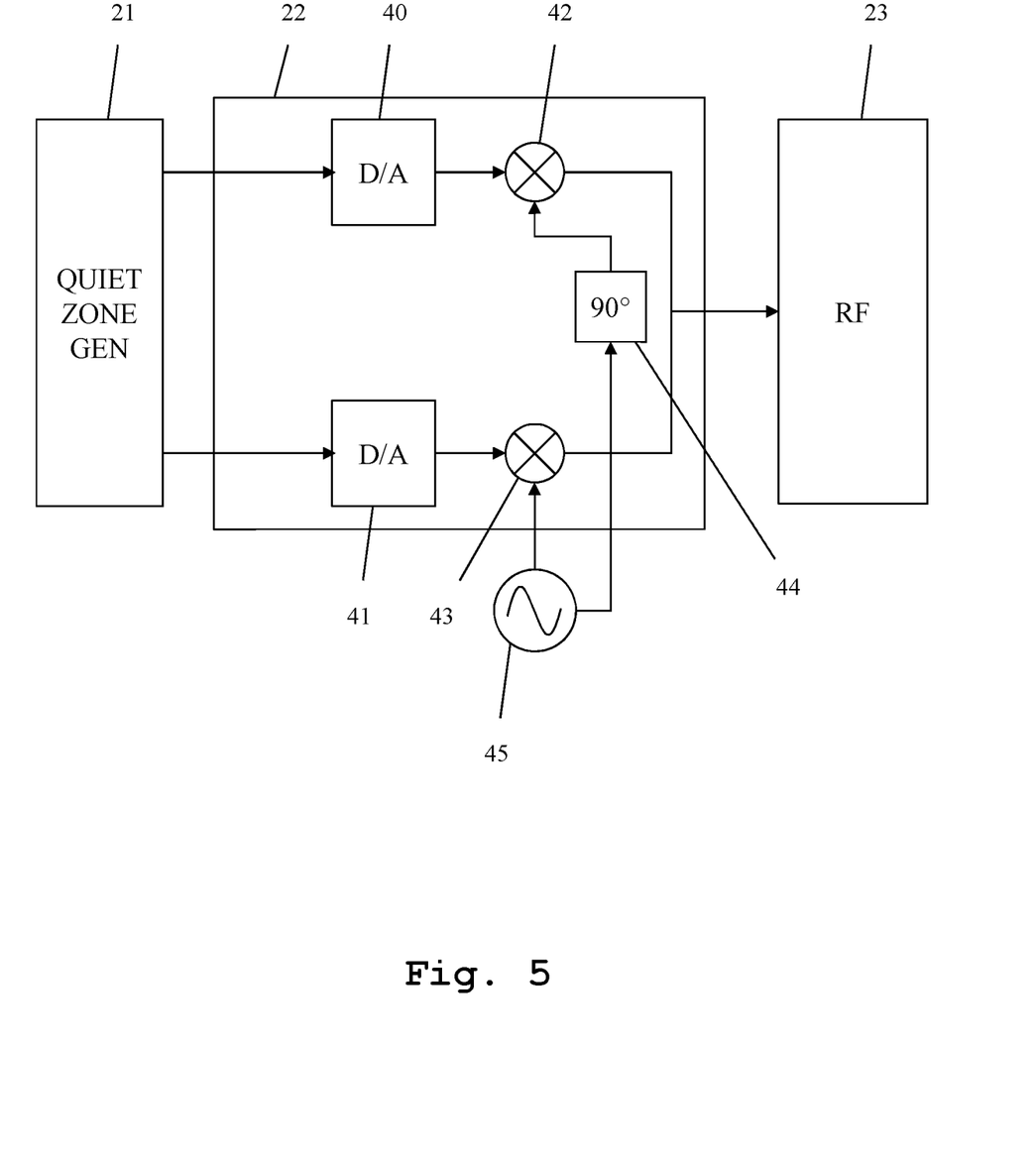
FIG. 5 shows a detailed embodiment of a fourth embodiment of the inventive measuring system.

In FIG. 5, further details regarding the baseband unit 22 are shown. Here, only a single baseband unit 22 out of the plurality of baseband units 22 of FIG. 4 is depicted. Also, here only the circuits for transmission are shown. The baseband unit 22 comprises two digital-analog-converters 40, 41, which are each connected to a mixer 42, 43. The outputs of the mixers 42, 43 are connected to each other.

The quiet zone generator 21 generates the inphase- and quadrature-component-signals and hands one of them to the digital-analog-converter 40 and one of them to the digital-analog-converter 41. The digital analog converters 40, 41 convert the signals into analog signals. The mixers 42, 43 mix the analog inphase- and quadrature-component-signals with a signal generated by a signal generator 45. The signal is a modulation signal. The mixer 42 is supplied with a phase shifted signal by a phase shifter 44, while the mixer 43 is directly supplied with the signal generator signal. The output signals of the mixers 42, 43 are combined and handed to the radio frequency unit 23.

Figure 6:
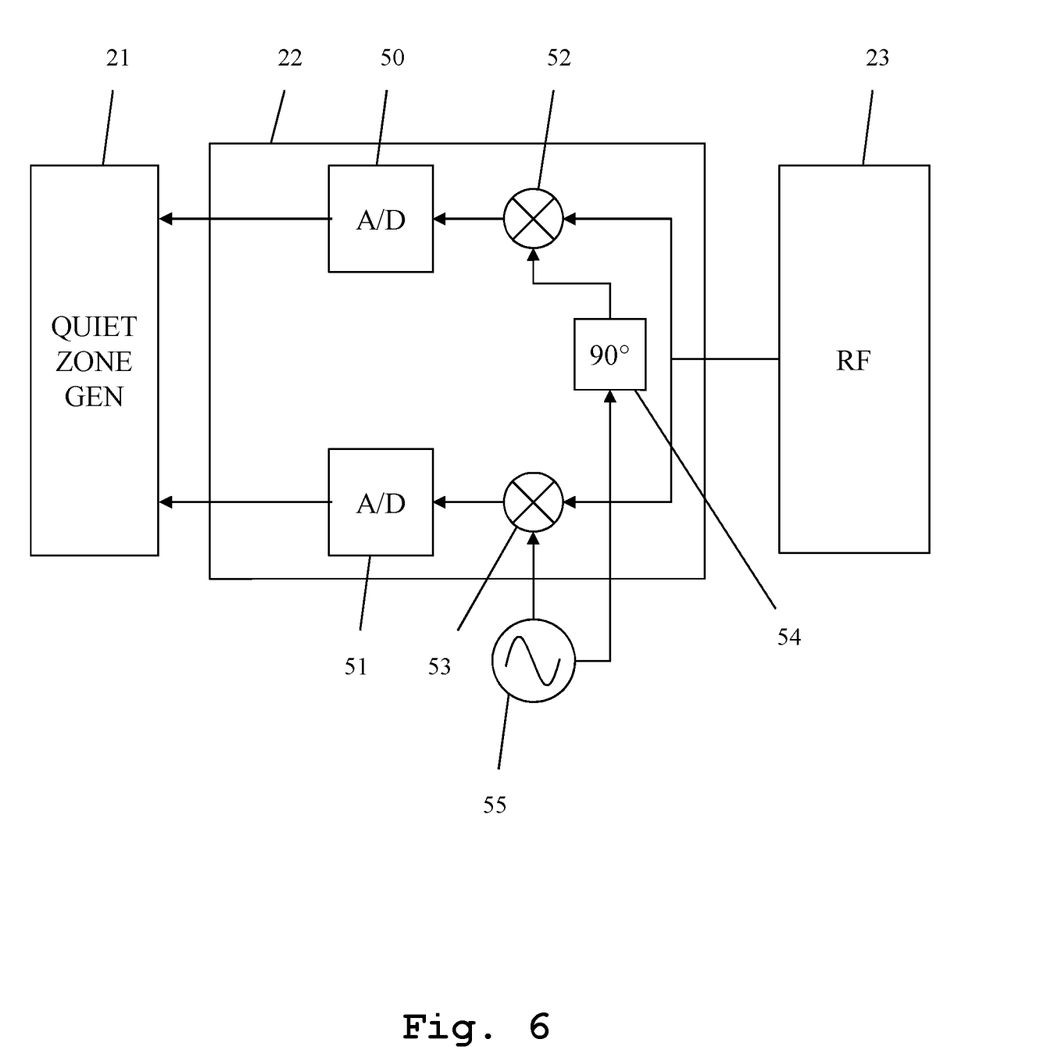
FIG. 6 shows a detailed view of a fifth embodiment of the inventive measuring system.

In FIG. 6, the alternative direction of processing is shown. Here, the function and circuitry of the baseband unit while receiving signals is shown. The radio frequency unit 23 provides a radio frequency signal to both mixers 52, 53. The mixer 52 is provided by a phase shifter 54 with a 90° phase shifted signal, generated by a signal generator 55. The mixer 53 is directly provided with the signal generated by the signal generator 55. Resulting output signals of the mixers 52, 53 are converted to digital signals by analog-digital-converters 50, 51. These digital signals are digital inphase- and quadrature-component signals. They are handed to the quiet zone generator 21, which performs the digital reception beamforming, as explained earlier.

Figure 7:
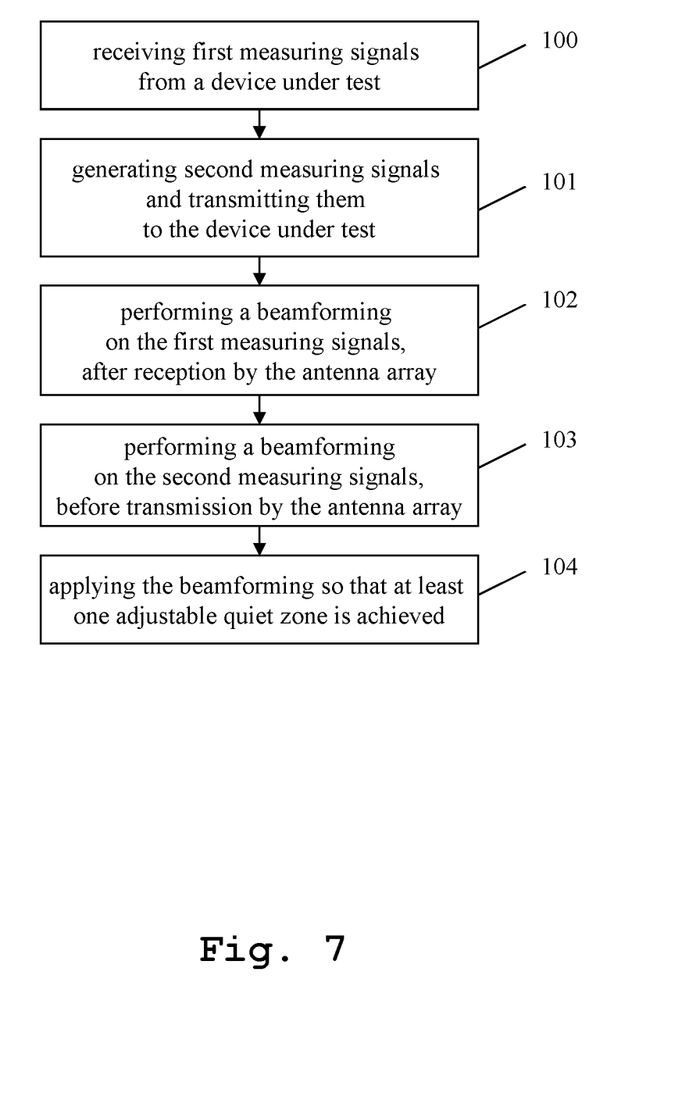
FIG. 7 shows an embodiment of the inventive measuring method.

Finally, in FIG. 7, an embodiment of the inventive measuring method is shown. In a first step 100, a first measuring signal is received from a device under test. In a second step 101, second measuring signals are generated and transmitted to the device under test. The first step and the second step can be performed in any order.

In a third step 102 a beamforming is performed on the first measuring signals after reception by the antenna array. In a fourth step 103, a beamforming is performed on the second measuring signals, before transmission by the antenna array. Also, the steps 102 and 103 can be performed in any order.

Finally, in a fifth step 104 the beamforming is applied so that at least one adjustable quiet zone is achieved.

The invention is not limited to the examples and especially not to specific numbers or shapes of quiet zones or types of devices under test. The characteristics of the exemplary embodiments can be used in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measuring system, for measuring properties of a device under test over the air, comprising:
an antenna array, configured to receive first measuring signals from the device under test,
a measuring device configured to process the first measuring signals by a radio frequency device, received by the antenna array, and generate second measuring signals and transmit them to the device under test, using the antenna array,
wherein the measuring device is configured to perform a beamforming on the first measuring signals, after reception by the antenna array to form at least one quiet zone,
wherein the measuring device is configured to generate an interference signal based on a digital manipulation of the second measuring signals, wherein at least one antenna of the antenna array is exclusively used to generate the interference signal,
wherein the measuring device is configured to generate the interference signal so that at least one antenna of the antenna array is exclusively used to generate the interference signal,
wherein the measuring device is configured to perform a beamforming of the interference signal,
wherein a part of the measuring device forming the at least one quiet zone is connected to a plurality of baseband generators and each of the baseband generators is connected to the radio frequency device,
wherein the measuring device forming the at least one quiet zone, the plurality of baseband generators, and the radio frequency devices form a plane wave converter that operates digitally in a baseband, and
wherein by adjusting the beamforming, a size and a quality of the at least one quiet zone are adjusted against each other.

2. The measuring system according to claim 1,
wherein the measuring device forming the at least one quiet zone is further configured to perform a beamforming on the second measuring signals, before transmission by the antenna array,
wherein the measuring device forming the at least one quiet zone is configured to apply the beamforming so that at least one adjustable quiet zone is achieved.

3. The measuring system according to claim 1,
wherein the measuring device forming the at least one quiet zone is configured to apply the beamforming so that the at least one quiet zone is movable.

4. The measuring system according to claim 1,
wherein measuring device forming the at least one quiet zone is configured to apply the beamforming so that at least one adjustable further quiet zone is achieved simultaneously to the at least one quiet zone.

5. The measuring system according to claim 1,
wherein the measuring device comprises an analyzer and/or signal generator, configured to analyze transmitted or received signals from and to the at least one quiet zone.

6. The measuring system according to claim 1,
wherein the measuring device forming the at least one quiet zone is configured to apply the beamforming so that the at least one quiet zone is in the near field of the antenna array.

7. The measuring system according to claim 1,
wherein the measuring device is adapted to generate the interference signal so that it is spatially overlapping at least in parts with the at least one quiet zone.

8. The measuring system according to claim 1,
wherein the measuring device is adapted to generate the interference signal so that it is angled by an angle $\Theta$ with regard to a beamforming beam generating the at least one quiet zone.

9. The measuring system according to claim 1,
wherein the measuring device is adapted to generate a plurality of interference signals simultaneously.

10. The measuring system according to claim 1,
wherein the measuring device comprises the plurality of baseband generators and the radio frequency devices for each antenna of the antenna array.

11. The measuring system according to claim 10,
wherein the radio frequency devices are configured to receive the first measuring signals from the antennas of the antenna array, and generate first baseband signals therefrom,
wherein the basebands are configured to generate first I/Q signals, based upon the first baseband signals,
wherein the measuring device forming the at least one quiet zone is configured to perform a reception beamforming on the first I/Q signals, in order to generate the at least one quiet zone.

12. The measuring system according to claim 11,
wherein the measuring device forming the at least one quiet zone is configured to generate second I/Q signals for processing by the basebands,
wherein the basebands are configured to generate second baseband signals based on the provided I/Q signals,
wherein the radio frequency devices are configured to generate the second measuring signals from the baseband signals and transmit them using the antennas of the antenna array, and
wherein the measuring device forming the at least one quiet zone is configured to generate the I/Q signals so as to implement a transmission beamforming generating the at least one quiet zone.

13. The measuring system according to claim 1, further comprising:
an anechoic chamber; and
wherein the antenna array and the device under test are arranged in the anechoic chamber.

14. The measuring system according to claim 13,
wherein the measuring device forming the at least one quiet zone is configured to perform the beamforming so that the at least one quiet zone is movable within the anechoic chamber.

15. A method for measuring properties of a device under test over the air, comprising the steps of:
receiving first measuring signals from the device under test, using an antenna array;
generating second measuring signals and transmitting them to the device under test, using the antenna array; and
performing a beamforming on the first measuring signals with a measuring device, after reception by the antenna array to form at least one quiet zone,
generating an interference signal based on a digital manipulation of the second measuring signals, wherein at least one antenna of the antenna array is exclusively used to generate the interference signal, generating the interference signal so that at least one antenna of the antenna array is exclusively used to generate the interference signal, performing a beamforming of the interference signal with the measuring device, connecting a part of the measuring device forming the at least one quiet zone to a plurality of baseband generators and connecting each of the baseband generators to a radiofrequency device, operating digitally a plane wave converter in a baseband formed by the measuring device, the plurality of baseband generators, and the radiofrequency devices, and adjusting the beamforming, in a manner that a size and a quality of the at least one quiet zone are adjusted against each other.

16. The method of claim 15 further comprising the steps of:

performing a beamforming on the second measuring signals, before transmission by the antenna array, and applying the beamforming so that at least one adjustable quiet zone is achieved.

* * * * *